United States Patent
Wu et al.

(10) Patent No.: US 11,976,358 B2
(45) Date of Patent: May 7, 2024

(54) ATOMIC LAYER DEPOSITION SYSTEM

(71) Applicant: Syskey Technology Co., Ltd., Hsinchu County (TW)

(72) Inventors: Hsueh-Hsien Wu, Hsinchu (TW); Chih-Yuan Chan, Hsinchu County (TW); Yi-Ting Lai, Hsinchu County (TW)

(73) Assignee: SYSKEY TECHNOLOGY CO., LTD., Hsinchu County (TW)

( * ) Notice: Subject to any disclaimer, the term of this patent is extended or adjusted under 35 U.S.C. 154(b) by 223 days.

(21) Appl. No.: 17/682,259

(22) Filed: Feb. 28, 2022

(65) Prior Publication Data

US 2023/0272528 A1 Aug. 31, 2023

(51) Int. Cl.
*C23C 16/455* (2006.01)

(52) U.S. Cl.
CPC .. *C23C 16/45544* (2013.01); *C23C 16/45565* (2013.01)

(58) Field of Classification Search
CPC ....... C23C 16/45544–45551; C23C 16/45565; C23C 16/45525–45555
See application file for complete search history.

(56) References Cited

U.S. PATENT DOCUMENTS

| | | | |
|---|---|---|---|
| 2003/0143328 A1* | 7/2003 | Chen | H01J 37/32082 |
| | | | 156/345.43 |
| 2017/0283948 A1* | 10/2017 | Chiu | H01J 37/32357 |
| 2019/0139807 A1* | 5/2019 | White | H01L 21/68764 |
| 2019/0139808 A1* | 5/2019 | White | C23C 16/4585 |

\* cited by examiner

*Primary Examiner* — Aiden Lee
(74) *Attorney, Agent, or Firm* — Muncy, Geissler, Olds & Lowe, P.C.

(57) ABSTRACT

An atomic layer deposition system is provided, including: a main body, a platform, a gas distribution showerhead assembly and a first ring member. The main body defines a reaction chamber, and the platform is located in the reaction chamber. The gas distribution showerhead assembly is disposed on the main body and includes at least one gas inlet channel and at least one gas diffusion plate. Each of the at least one gas diffusion plate includes a plurality of through holes. The first ring member defines a radial direction and is disposed between the platform and the at least one gas diffusion plate. A region of the at least one gas diffusion plate distributed with the plurality of through holes defines an outermost distribution profile. An inner circumferential wall of the first ring member and the outermost distribution profile keep a distance in the radial direction.

8 Claims, 5 Drawing Sheets

ATOMIC LAYER DEPOSITION SYSTEM

BACKGROUND OF THE INVENTION

Field of the Invention

The present invention relates to an atomic layer deposition system.

Description of the Prior Art

Generally, an atomic layer deposition system (ALD) includes a reaction chamber, at least one gas inlet and at least one gas outlet. The at least one gas inlet and the at least one gas outlet allow different reaction gases to be supplied into the reaction chamber in sequence so that a substrate located in the reaction chamber can contact and react with said reaction gases so as to form layered films thereon.

However, active ingredients in the said reaction gases are easily deposited on an inner wall of the reaction chamber, which results in rapid accumulation of film residues on the inner wall and poor deposition quality of the substrate. Therefore, the reaction chamber has to be cleaned regularly to remove the film residues by equipment manufacturers, which increases manufacturing cost and reduces manufacturing efficiency.

The present invention is, therefore, arisen to obviate or at least mitigate the above-mentioned disadvantages.

SUMMARY OF THE INVENTION

The main object of the present invention is to provide an atomic layer deposition system, which can avoid residues generated on an inner wall of its reaction chamber so as to effectively reduce production cost and provide good manufacturing quality.

To achieve the above and other objects, the present invention provides a atomic layer deposition system, including: a main body, a platform, a gas distribution showerhead assembly and a first ring member. The main body defines a reaction chamber. The platform is located in the reaction chamber and configured for a substrate to be disposed thereon. The gas distribution showerhead assembly is disposed on the main body and includes at least one gas inlet channel and at least one gas diffusion plate located between the platform and the at least one gas inlet channel. The at least one gas inlet channel is configured to supply at least one reaction gas to the reaction chamber. Each of the at least one gas diffusion plate includes a plurality of through holes disposed therethrough. The first ring member defines a radial direction and disposed between the platform and the at least one gas diffusion plate. A region of one of the at least one gas diffusion plate distributed with the plurality of through holes defines an outermost distribution profile. A diametrical dimension of an inner circumferential wall of the first ring member is larger than a diametrical dimension of the outermost distribution profile. The inner circumferential wall of the first ring member and the outermost distribution profile keep a distance in the radial direction.

The present invention will become more obvious from the following description when taken in connection with the accompanying drawings, which show, for purpose of illustrations only, the preferred embodiment(s) in accordance with the present invention.

DETAILED DESCRIPTION OF THE PREFERRED EMBODIMENTS

Figure 1:
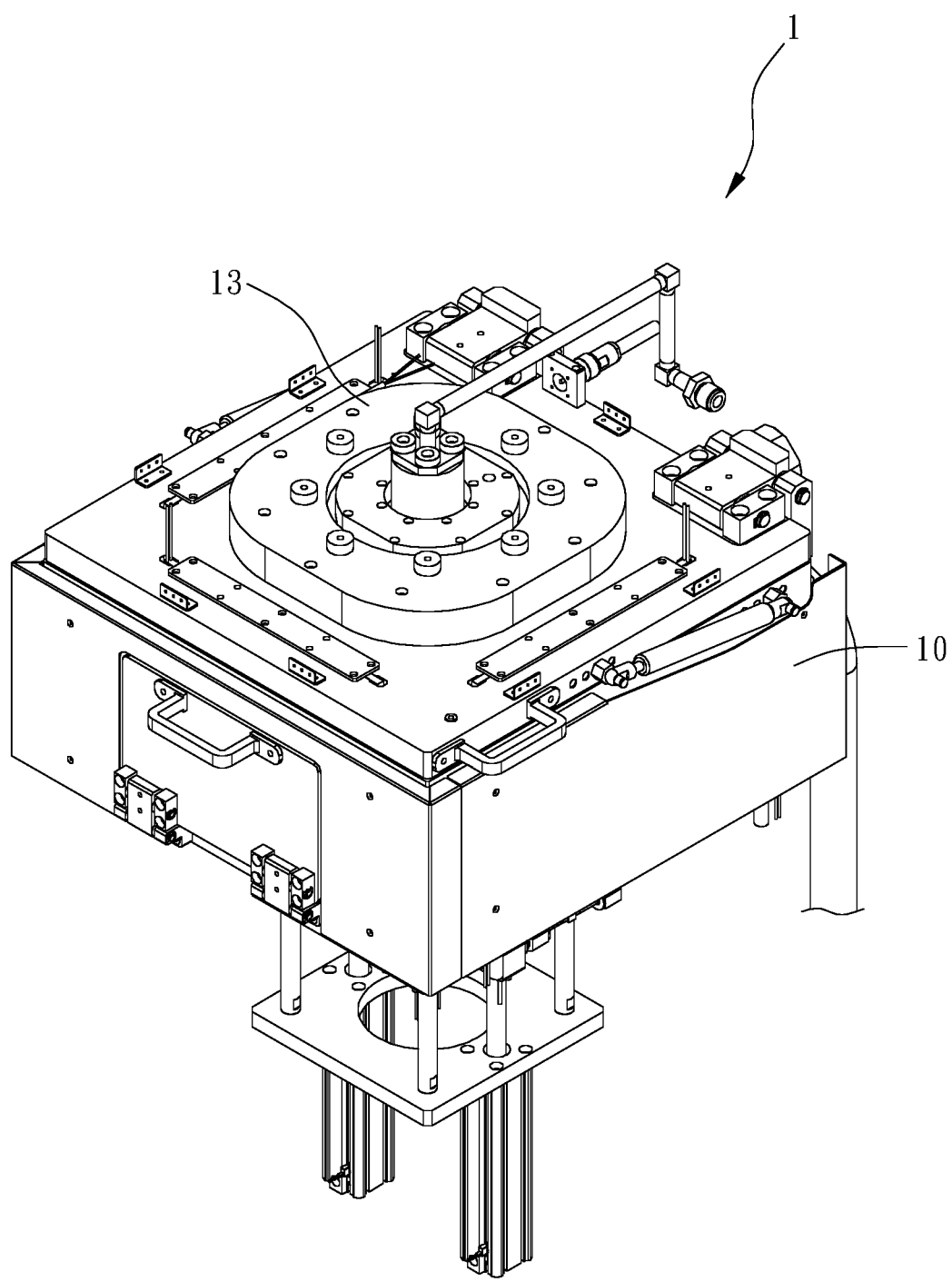
FIG. 1 is a stereogram of a preferable embodiment of the present invention.
Figure 2:
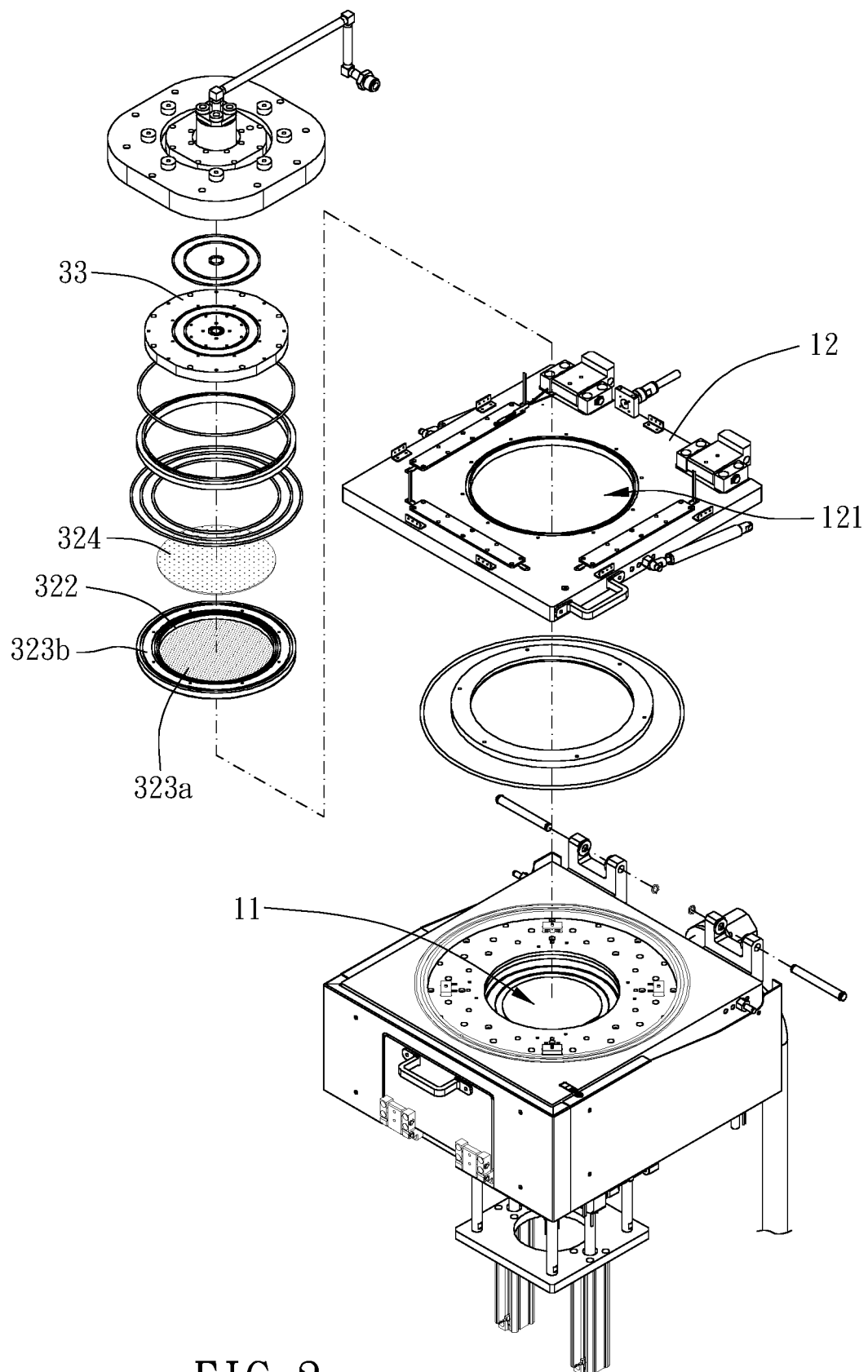
FIG. 2 is a partial breakdown drawing of a preferable embodiment of the present invention.
Figure 3:
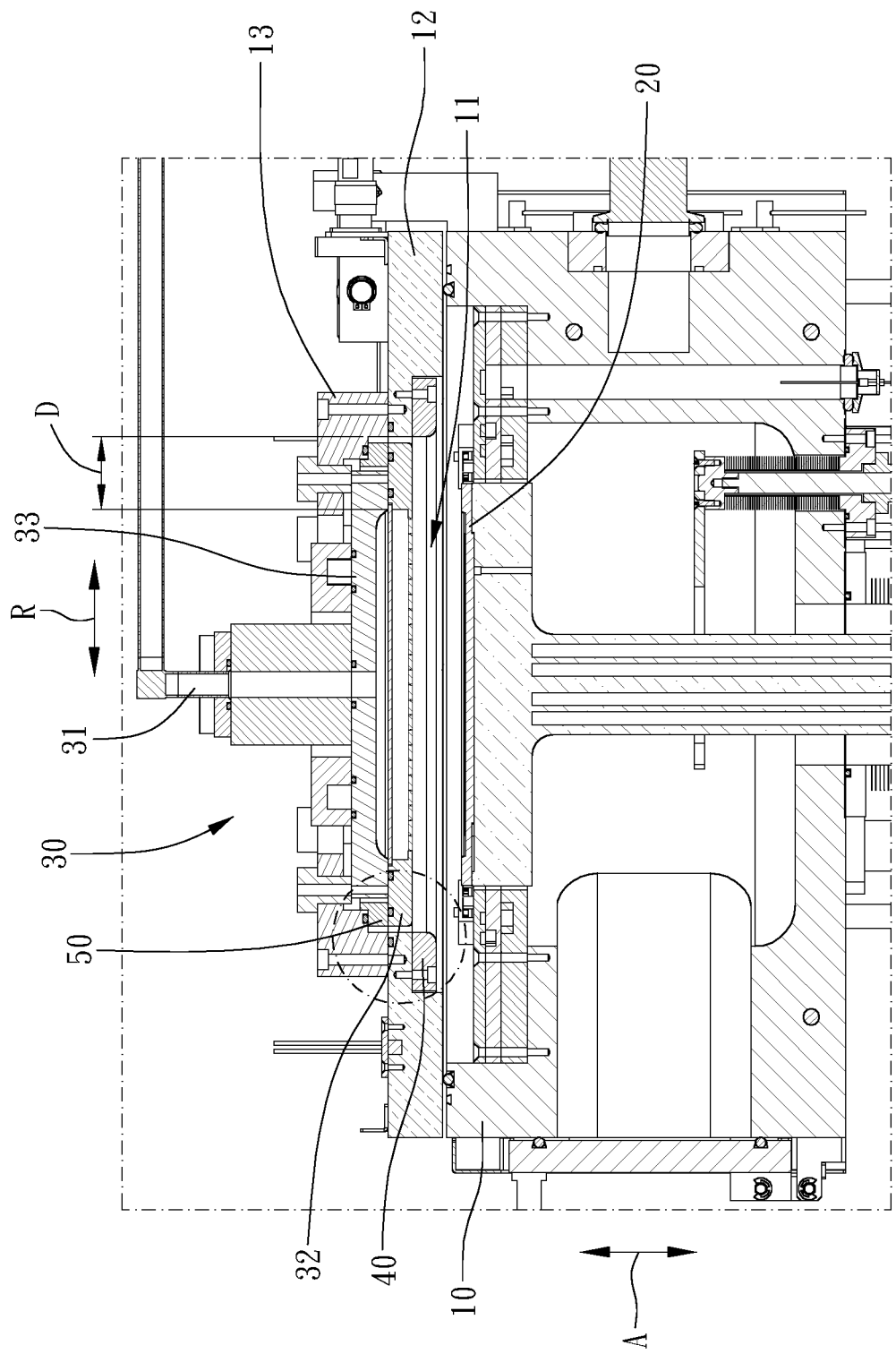
FIG. 3 is a partial cross-sectional view of a preferable embodiment of the present invention.
Figure 4:
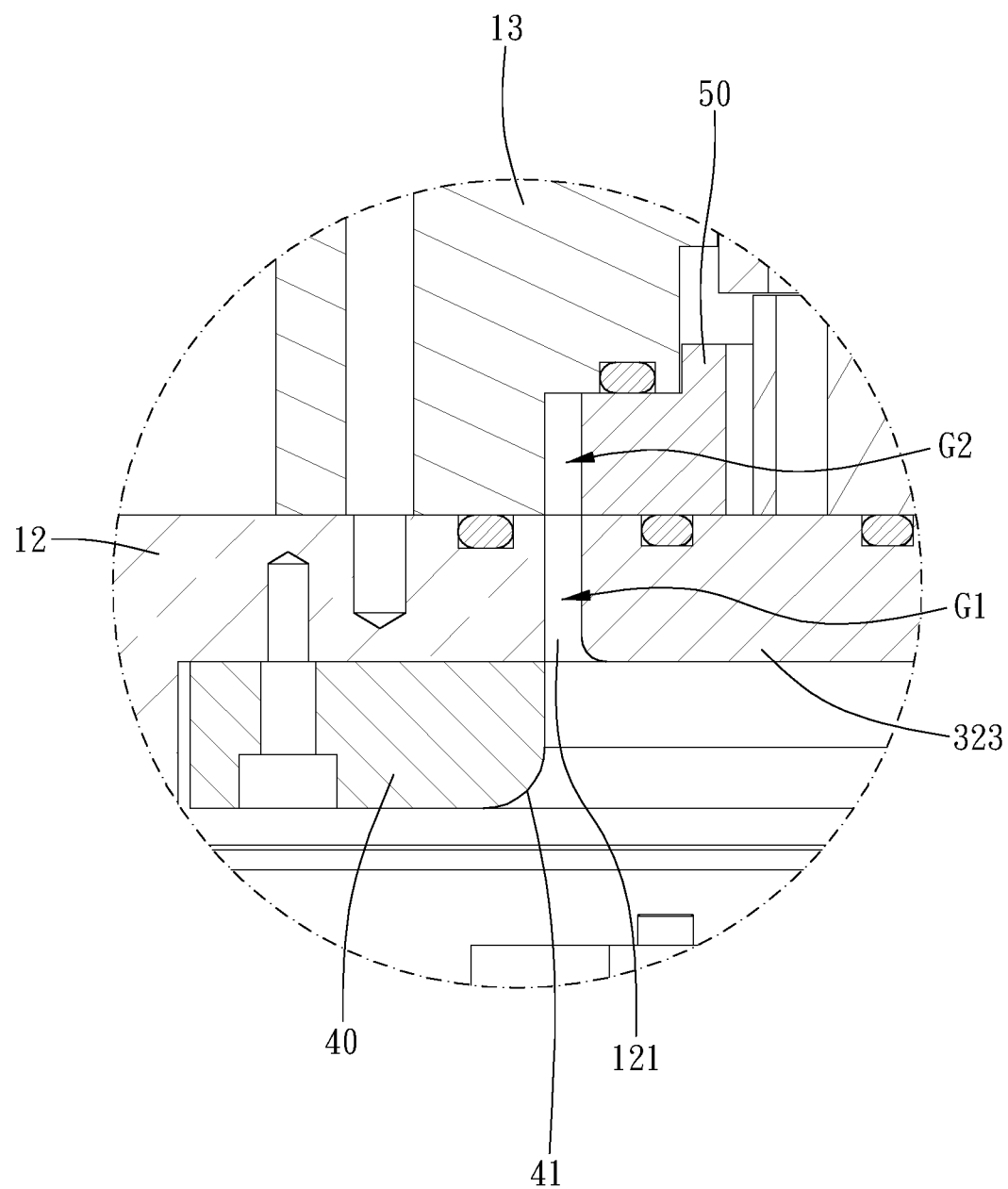
FIG. 4 is an enlargement of FIG. 3.
Figure 5:
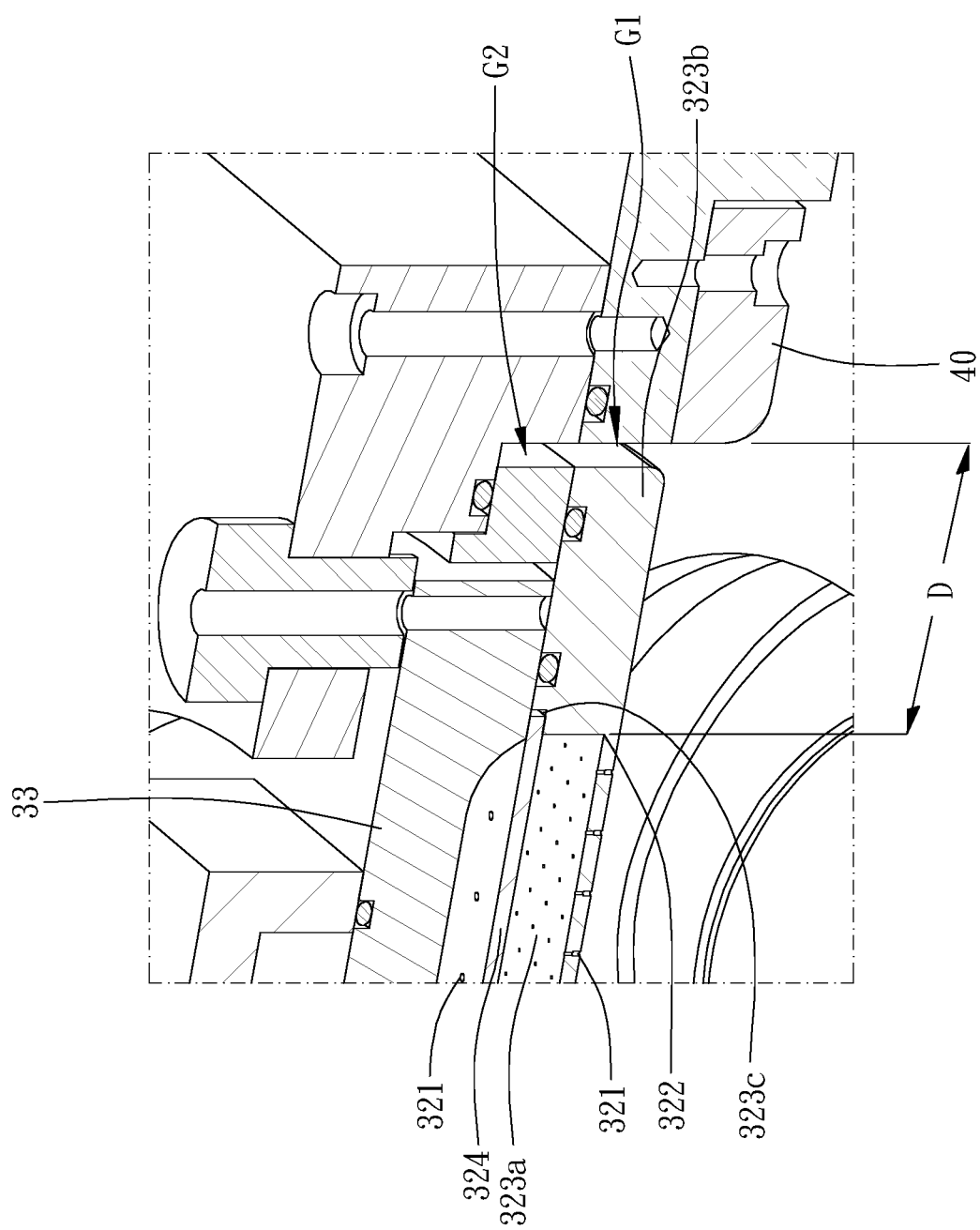
FIG. 5 is partial enlarged cross-sectional view of a preferable embodiment of the present invention.

Please refer to FIGS. 1 to 5 for a preferable embodiment of the present invention. An atomic layer deposition system 1 of the present invention includes a main body 10, a platform 20, a gas distribution showerhead assembly 30 and a first ring member 40.

The main body 10 defines a reaction chamber 11. The platform 20 is located in the reaction chamber 11 and configured for a substrate to be disposed thereon. The gas distribution showerhead assembly 30 is disposed on the main body 10 and includes at least one gas inlet channel 31 and at least one gas diffusion plate 32 located between the platform 20 and the at least one gas inlet channel 31. The at least one gas inlet channel 31 is configured to supply at least one reaction gas to the reaction chamber 11, and each of the at least one gas diffusion plate 32 includes a plurality of through holes 321 disposed therethrough. The first ring member 40 defines a radial direction R and is disposed between the platform 20 and the at least one gas diffusion plate 32. A region of one of the at least one gas diffusion plate 32 distributed with the plurality of through holes 321 defines an outermost distribution profile 322. A diametrical dimension of an inner circumferential wall of the first ring member 40 is larger than a diametrical dimension of the outermost distribution profile 322. The inner circumferential wall of the first ring member 40 and the outermost distribution profile 322 keep a distance D in the radial direction R. Therefore, the first ring member 40 is radially distant from a flow path of the at least one reaction gas to reduce contacts and avoid residues generated on a wall surface of the reaction chamber 11.

Preferably, the distance D is larger than or equal to 5 mm; in an axial direction A lateral to the radial direction R, each of the at least one gas diffusion plate 32 is misaligned with the first ring member 40 so that the first ring member 40 is distant from the flow path of the at least one reaction gas to reduce contact reaction. A side of the first ring member 40 remote from the gas distribution showerhead assembly 30 has an arcuate chamfer 41 disposed thereon to provide diversion effect. Specifically, the distance D also allows the first ring member 40 to be radially distant from the substrate on the platform 20, which effectively slows down the flow rate of the at least one reaction gas to sufficiently and uniformly contact and react with a surface of the substrate, and reduces influence on a deposition reaction of the substrate due to unexpected residues on the first ring member 40.

The main body 10 includes a cover 12 and a closing assembly 13, and the closing assembly 13 is detachably connected with the cover 12 and the gas distribution showerhead assembly 30. The at least one gas diffusion plate 32 is at least partially received within a penetrating hole 121 of the cover 12 and defines a first circumferential gap G1 with the cover 12 so as to avoid short circuits. In this embodiment, the first ring member 40 is disposed on a side of the cover 12 remote from the closing assembly 13, and the inner circumferential wall of the first ring member 40 is flushed with an inner circumferential wall of the cover 12 defining the penetrating hole 121, which is convenient for assembling, disassembling and replacement of the at least one gas diffusion plate 32. However, the inner circumferential wall of the first ring member may radially protrude beyond or retract relative to the inner circumferential wall of the cover defining the penetrating hole.

The atomic layer deposition system 1 further includes a second annular ring 50 disposed between the gas distribution showerhead assembly 30 and the closing assembly 13, and an outer circumferential wall of the second annular ring 50 and the closing assembly 13 have a second circumferential gap G2 therebetween. The gas distribution showerhead assembly 30 further includes a cover plate 33 connected between the closing assembly 13 and the at least one gas diffusion plate 32, and the cover plate 33 covers the plurality of through holes 321 in the axial direction A. The second annular ring 50 is sleeved around the cover plate 33 and axially abutted against the closing assembly 13 so as to provide good assembling stability and sealing effect.

Specifically, the first ring member 40 and the second annular ring 50 are respectively made of a material including at least one of ceramic and metal oxide which provides low surface activity and low reactivity with the at least one reaction gas. Preferably, the first circumferential gap G1 is adjacent to the second circumferential gap G2 and respectively have a width which is larger than or equal to 1 mm in the radial direction R.

Preferably, the at least one gas diffusion plate 32 includes a first diffusion plate 323 and a second diffusion plate 324, and the second diffusion plate 324 is located at a side of the first diffusion plate 323 remote from the platform 20. A density of distribution of the plurality of through holes 321 on the second diffusion plate 324 is lower than a density of distribution of the plurality of through holes 321 on the first diffusion plate 323 so that the at least one reaction gas can be uniformly introduced into the reaction chamber 11, which effectively avoids unstable airflow and damage to the deposition quality. The first diffusion plate 323 includes a diffusion portion 323a having the plurality of through holes 321 and a connecting portion 323b surrounding the diffusion portion 323a, and the connecting portion 323b is axially connected with the cover plate 33 and spacingly corresponds to the cover 12 in the radial direction R. In this embodiment, the connecting portion 323b and the diffusion portion 323a are formed in one piece so as to have good structural strength; a border between an inner circumferential wall of the connecting portion 323b and the diffusion portion 323a defines the outermost distribution profile 322 which is circular; a side of the connecting portion 323b axially remote from the platform 20 has a positioning ring groove 323c, and the second diffusion plate 324 is received within the positioning ring groove 323c, which provides a simple structure and is convenient to be assembled. However, the second diffusion plate may be mounted to one of the first diffusion plate and the cover plate; the gas distribution showerhead assembly may have only one said gas diffusion plate.

Although particular embodiments of the invention have been described in detail for purposes of illustration, various modifications and enhancements may be made without departing from the spirit and scope of the invention. Accordingly, the invention is not to be limited except as by the appended claims.

What is claimed is:

1. An atomic layer deposition system, including:
a main body, defining a reaction chamber;
a platform, located in the reaction chamber and configured for a substrate to be disposed thereon;
a gas distribution showerhead assembly, disposed on the main body and including at least one gas inlet channel and at least one gas diffusion plate located between the platform and the at least one gas inlet channel, the at least one gas inlet channel configured to supply at least one reaction gas to the reaction chamber, the at least one gas diffusion plate including a plurality of through holes disposed therethrough; and
a first ring member, defining a radial direction, disposed between the platform and the at least one gas diffusion plate;
wherein a region of the at least one gas diffusion plate distributed with the plurality of through holes defines an outermost distribution profile by connecting a portion of the plurality of through holes located radially outermost, a diametrical dimension of an inner circumferential wall of the first ring member is larger than a diametrical dimension of the outermost distribution profile, and the inner circumferential wall of the first ring member and the outermost distribution profile keep a distance in the radial direction;
wherein the main body includes a cover and a closing assembly, the closing assembly is detachably connected with the cover and the gas distribution showerhead assembly, and the at least one gas diffusion plate is at least partially received within a penetrating hole of the cover and defines a first circumferential gap with the cover;
wherein the atomic layer deposition system further includes a second annular ring disposed between the gas distribution showerhead assembly and the closing assembly, an outer circumferential wall of the second annular ring and the closing assembly have a second circumferential gap therebetween.

2. The atomic layer deposition system of claim 1, wherein the at least one gas diffusion plate includes a first diffusion plate and a second diffusion plate, the second diffusion plate is located at a side of the first diffusion plate remote from the platform, and a density of distribution of the plurality of through holes on the second diffusion plate is lower than a density of distribution of the plurality of through holes on the first diffusion plate.

3. The atomic layer deposition system of claim 1, wherein the first ring member is made of a material including at least one of ceramic and metal oxide.

4. The atomic layer deposition system of claim 1, wherein in an axial direction lateral to the radial direction, the at least one gas diffusion plate is not overlapped with the first ring member.

5. The atomic layer deposition system of claim 1, wherein the distance is larger than or equal to 5 mm.

6. The atomic layer deposition system of claim 1, wherein the gas distribution showerhead assembly further includes a cover plate connected between the closing assembly and the at least one gas diffusion plate, the cover plate covers the plurality of through holes in an axial direction lateral to the radial direction, and the second annular ring is sleeved around the cover plate and axially abutted against the closing assembly.

7. The atomic layer deposition system of claim 1, wherein the first ring member is disposed on a side of the cover and remote from the closing assembly, and the inner circumferential wall of the first ring member is flush with an inner circumferential wall of the cover defining the penetrating hole.

8. The atomic layer deposition system of claim 1, wherein the first ring member and the second annular ring are respectively made of a material including at least one of ceramic and metal oxide; in an axial direction lateral to the radial direction, of the at least one gas diffusion plate is not overlapped with the first ring member; the distance is larger than or equal to 5 mm; a side of the first ring member remote from the gas distribution showerhead assembly has an arcuate chamfer disposed thereon; the first circumferential gap is adjacent to the second circumferential gap and respectively have a width which is larger than or equal to 1 mm in the radial direction; the gas distribution showerhead assembly further includes a cover plate connected between the closing assembly and the at least one gas diffusion plate, the cover plate covers the plurality of through holes in an axial direction lateral to the radial direction, and the second annular ring is sleeved around the cover plate and axially abutted against the closing assembly; the first ring member is disposed on a side of the cover and remote from the closing assembly, and the inner circumferential wall of the first ring member is flush with an inner circumferential wall of the cover defining the penetrating hole; the at least one gas diffusion plate includes a first diffusion plate and a second diffusion plate, the second diffusion plate is located at a side of the first diffusion plate remote from the platform, and a density of distribution of the plurality of through holes on the second diffusion plate is lower than a density of distribution of the plurality of through holes on the first diffusion plate; the first diffusion plate includes a diffusion portion having the plurality of through holes and a connecting portion surrounding the diffusion portion, the connecting portion is axially connected with the cover plate and spacingly corresponds to the cover in the radial direction; the connecting portion and the diffusion portion are formed in one piece; and a side of the connecting portion axially remote from the platform has a positioning ring groove, and the second diffusion plate is received within the positioning ring groove.

* * * * *